(12) United States Patent
Uesaka et al.

(10) Patent No.: US 8,690,583 B2
(45) Date of Patent: Apr. 8, 2014

(54) PROBE CONNECTOR

(75) Inventors: Ryo Uesaka, Ebina (JP); Akinori Mizumura, Yamato (JP); James Maroney, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 437 days.

(21) Appl. No.: 13/123,598

(22) PCT Filed: Oct. 12, 2009

(86) PCT No.: PCT/US2009/060369
§ 371 (c)(1),
(2), (4) Date: Jul. 1, 2011

(87) PCT Pub. No.: WO2010/042926
PCT Pub. Date: Apr. 15, 2010

(65) Prior Publication Data
US 2011/0254575 A1 Oct. 20, 2011

(30) Foreign Application Priority Data
Oct. 10, 2008 (JP) .................... 2008-264073

(51) Int. Cl.
*H01R 12/00* (2006.01)
(52) U.S. Cl.
USPC .......................................................... 439/63
(58) Field of Classification Search
USPC ........ 439/63, 66, 581, 824, 700, 541.5, 540.1
See application file for complete search history.

(56) References Cited

U.S. PATENT DOCUMENTS

| | | | |
|---|---|---|---|
| 4,740,746 A | 4/1988 | Pollock et al. | |
| 4,895,530 A | 1/1990 | Gugelmeyer et al. | |
| 6,278,285 B1 * | 8/2001 | Weber et al. | 324/756.02 |
| 6,299,479 B1 * | 10/2001 | Tang | 439/578 |
| 7,766,662 B2 * | 8/2010 | Akama et al. | 439/63 |
| 8,333,595 B2 * | 12/2012 | Uesaka et al. | 439/63 |
| 8,382,488 B2 * | 2/2013 | Uesaka | 439/66 |

FOREIGN PATENT DOCUMENTS

| | | |
|---|---|---|
| JP | 60-123665 | 8/1985 |
| JP | 60-123666 | 8/1985 |
| WO | WO 2008/120856 A1 | 10/2008 |

\* cited by examiner

*Primary Examiner* — Renee S Luebke
*Assistant Examiner* — Harshad Patel
(74) *Attorney, Agent, or Firm* — Timothy M. Morella

(57) ABSTRACT

A probe connector (1) connects a circuit board (2) and a coaxial plug (3) including an axial terminal (162) and a surrounding terminal (163). A coaxial probe (51) of the probe connector includes a center terminal (52) connected to the circuit board and the axial terminal; and an outer terminal (61) coaxial with the center terminal and connected to the circuit board and the surrounding terminal. The outer terminal includes an cylindrical outer conductor (62) surrounding the center terminal and mated with the surrounding terminal; an anchor (63) formed, as a projection (69), on part of an outer surface of the outer conductor by machining process so that a hole is formed on the part of the outer surface; and a conductive cover (91) covering and closing the hole and electrically conducted to the outer conductor. Thus, the position of the coaxial probe is slightly shifted even when the coaxial plug is inserted thereto or pulled therefrom.

10 Claims, 14 Drawing Sheets

Fig. 3
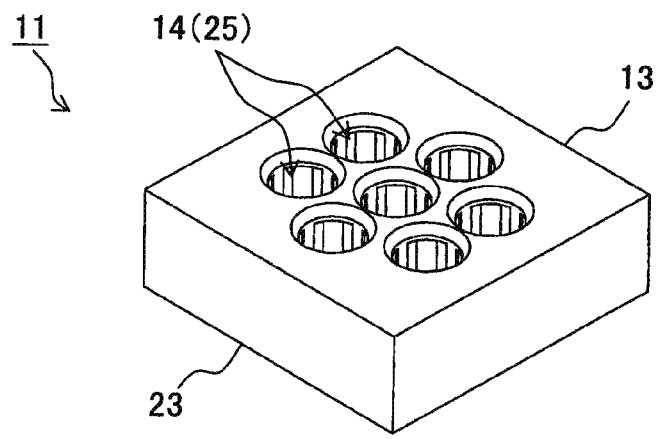
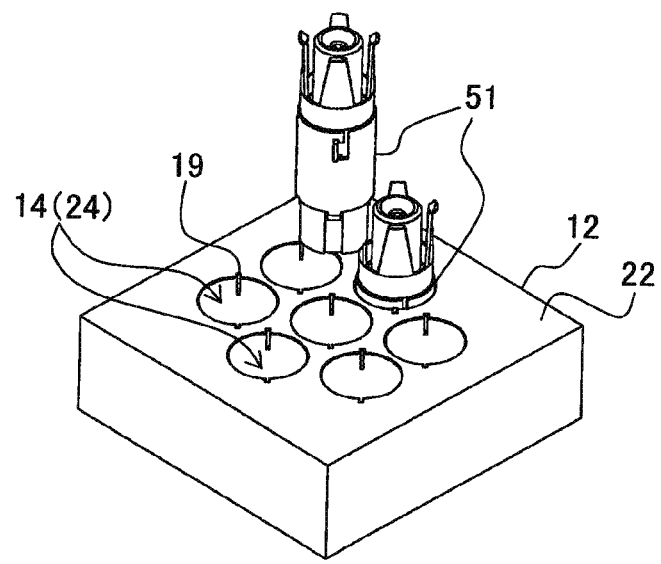

Prior Art

Prior Art

PROBE CONNECTOR

BACKGROUND

1. Field

The Present Disclosure relates, generally, to a probe connector, and, more particularly, to a probe connector in which the position of the coaxial probe is slightly displaced or deviated when the coaxial plug is either inserted thereto or pulled therefrom.

2. Description of The Related Art

Japanese Utility Model Application No. 60-123666 purports to disclose a coaxial movable contact probe 851 used in an inspection apparatus, as shown in FIG. 16. The coaxial movable contact probe 851 includes a center conductor 852 and an outer conductor 861—having a plain cylindrical shape and surrounding the center conductor 852. As shown in FIG. 17, the probes 851 are held by a movable plate 802, which is movable relative to an inspection target circuit board 801 on which an inspection target Integrated Circuit ("IC") is mounted. Further, coaxial connectors ("coaxial plugs") 961 are connected to one end of the probes 851. Each coaxial plug 961 is connected, via a coaxial cable 962, to a measuring circuit board (not shown) on which a signal generator circuit, a comparator, etc. may be mounted. At inspection, the movable plate 802 is moved toward the inspection target circuit board 801 to bring the other ends of the probes 851 into contact with the inspection target circuit board 801. Consequently, the coaxial plugs 961 and the circuit board 801 are connected thereto by the probes 851, thereby coupling the inspection target circuit board 801 and the measuring circuit board. When the coaxial probe 851 of coaxial structure-type is used, the attenuation or reflection of high-frequency components of signals are less likely to occur in the probes. Therefore, an input signal outputted by a signal generator circuit in the measuring circuit board is transferred or transmitted to the inspection target circuit board 801 via the probe 851 as maintaining its waveform satisfactorily. Further, an output signal outputted by the inspection target IC in the inspection target circuit board 801 is transmitted to the measuring circuit board via the probe 851 as maintaining its waveform satisfactorily.

However, the probe 851 of the '666 Application has a plain cylindrical shape and is merely press-fit in a cavity 814 formed in the movable plate 802. Therefore, the probe 851 may be displaced or shifted relative to the movable plate 802 when, for example, the coaxial plug 961 is inserted to or pulled from the probe 851. This causes projection amounts of the probes 851 from the single movable plate 802 to be unequal or non-uniform between the probes 851 which are press-fitted in the single movable plate 802. Therefore, although each of the probes adopts an expansible and contractible probe structure so as to be capable of coming into elastic contact with the inspection target circuit board 801, the contact pressures of the probes 851 with respect to the inspection target circuit board 801 vary between the probes 851. Further, if a range of the variation of the projection amounts becomes great, a range of the variation of the contact pressures between the probes 851 with respect to the inspection target circuit board 801 does not fall within a predetermined high pressure range, and thus a range of variation of contact resistances between the probes 851 with respect to the inspection target circuit board 801 does not fall within a predetermined range.

SUMMARY

An object of the present disclosure is to provide a probe connector in which the position of the coaxial probe is hardly displaced or deviated even when the coaxial plug is inserted thereto or pulled therefrom. Pursuant to this, there is provided a probe connector which connects a circuit board and a coaxial plug including an axial terminal and a surrounding terminal, the probe connector comprising a coaxial probe including a center terminal which is electrically connected to the axial terminal of the coaxial plug and to the circuit board, and an outer terminal which is coaxial with the center terminal and is electrically connected to the surrounding terminal and to the circuit board; wherein the outer terminal includes an outer conductor which is formed in a cylindrical shape surrounding the center terminal and is mated with the surrounding terminal, an anchor which is formed, as a projection, on part of an outer surface of the outer conductor so that a hole is formed on the part of the outer surface, and a conductive cover which covers the hole and which is electrically conducted to the outer conductor.

In the coaxial probe, the anchor is formed as a projection projected from the surface of the outer terminal. In a case that the probe connector includes, for example, a housing which is to be attached to the circuit board or the like and that a cavity is formed penetrating through the housing and the coaxial probe is inserted in the cavity, the anchor may be engaged with the housing in a state that the coaxial probe is inserted in the cavity. That is, the coaxial probe and the housing may be engaged with each other via the anchor of the outer terminal. Since the coaxial probe is held by the housing with this engagement, the coaxial probe is hardly displaced or shifted relative to the housing even when the coaxial plug is inserted to or pulled from the coaxial probe. Since it is enough that the anchor functions as an engage portion which prevents the coaxial probe from coming off or being disengaged as described above, the anchor may be engaged with another member which is other than the housing and which includes, for example, a holding plate, etc.

Since the coaxial probe is not easily displaced even when the coaxial plug is inserted thereto or pulled therefrom, the projection amounts of a plurality of the coaxial probes which are attached to the single housing, etc. can be maintained based on the initial alignment. Further, since the projection amounts of the coaxial probes are stably kept substantially in a predetermined state, it is possible to make the range of contact pressure variation between the coaxial probes with respect to the circuit board fall within a desired high pressure range, thereby making a range of variation of contact resistances between the coaxial probes with respect to the circuit board within a desired range.

Further, the coaxial probe of the present disclosure has a coaxial structure adopting the outer conductor having a cylindrical shape. Since the outer conductor is generally made of metal, a projection portion such as the anchor is suitably formed by a machining process. By adopting a machining process to form the anchor, it is possible to form the anchor as a projection on the cylindrical outer conductor even when the outer conductor has a small diameter of 1-3 mm so as to be used, for example, in an IC inspection and test apparatus. Further, by forming the anchor by a machining process, there is no need to increase the diameter size of the outer conductor for the purpose of forming the anchor on the outer conductor, and thus it is possible to attach, to the housing etc., a plurality of pieces of the coaxial probe having a size the same as that of coaxial probes in which the anchor is not formed. That is, in a housing having a predetermined size, for example, the coaxial probes can be attached to the housing in a channel number same as that of the case using the coaxial probes that do not have the anchor.

However, as described above, in a case that the anchor is formed by the machining process, the hole is also formed corresponding to the anchor in the cylindrical outer conductor. The machining hole causes the attenuation, the reflection and/or the like of high-frequency components of a signal. Therefore, in the present disclosure, the hole, which is formed in the cylindrical outer conductor as a result of the projection of the anchor, is covered by the conductive cover electrically connected to the outer conductor. By covering the machining hole with the conductive cover, the outer surface of the outer conductor, including the part of the outer surface at which the machining hole is formed, is covered by metal and thus is electrically uniform. Therefore, the attenuation and/or reflection of high-frequency components of a signal is less likely to occur in the coaxial probe. Further, it is possible to suppress the insertion loss of the high-frequency components of the signal (DIP characteristic causing a large loss in a high-frequency band) ascribable to the insertion of the probe connector. Further, signals transmitted via the center terminals of the coaxial probes hardly leak from the coaxial probes, thereby preventing the crosstalk between the signals effectively. As a result, for example, in a case that two circuit boards are connected by the probe connector, signals are transmitted between the two circuit boards such that the signals from the one circuit board to the other circuit board are transmitted while maintaining the signal-outputted size and waveform as outputted from the one of the circuit boards.

In the present disclosure, the probe connector may further include a thin cylinder portion which is formed on the outer conductor at another part, of the outer conductor, nearer to a side of the circuit board than the part at which the anchor is formed, and which is formed to have a cylindrical shape thinner than the part at which the anchor is formed; an outer coil spring in which the thin cylinder portion is inserted; and a cylindrical contact which is formed in a cylinder shape, into an end of which an end of the thin cylinder portion is inserted, and the other end of which projects from the housing to come into contact with the circuit board. In this case, when the housing is attached to the circuit board, the cylindrical contact may move along the thin cylinder portion to compress the outer coil spring to be brought into pressure contact with the circuit board by a spring force of the outer coil spring.

In the present disclosure, the cylindrical contact is in pressure contact with the circuit board owing to the spring force of the outer coil spring in the state that the housing is attached to the circuit board. This pressure contact can maintain the range of contact resistance variation between the cylindrical contacts with respect to the circuit board within a desired range. In particular, since the outer coil spring of each of the coaxial probes is compressed between the outer conductor which is positioned in the housing or the like by the anchors and the cylindrical contact which is in contact with the circuit board, it is possible to uniformize the contact pressures among a plurality of pieces of the cylindrical contact with respect to the circuit board in a state that the housing is attached to the circuit board. This makes it possible to reduce the contact resistance variation between the cylindrical contacts with respect to the circuit board.

Further, since the cylindrical contact is brought into contact with the circuit board in a pressured state, little clearance or gap is defined between the circuit board and the cylindrical contact. As a result, it is possible to prevent the signal leakage due to such a clearance or gap and to greatly reduce the crosstalk. On the other hand, for example, in a case that one end of the outer terminal is formed in a leaf spring structure and that this leaf spring structure brings the outer terminal into pressure contact with the circuit board in order to make the range of the contact resistance variation between the outer terminals with respect to the circuit board fall in a desired range, then a large clearance or gap is defined between the outer terminal and the circuit board and the signal easily leaks from the clearance or gap.

As described above, by regulating or maintaining the range of the contact resistance variation in the desired range and by suppressing the signal leakage, the attenuation and/or the reflection of the signal hardly occurs also in the high frequency range, the crosstalk is reduced, and the insertion loss ascribable to the insertion of the probe connector (DIP characteristic) is reduced. Therefore, it is possible to further suitably maintain the intensity and waveform of the signal transmitted between two circuit boards connected via this probe connector, even in the high frequency signal or component.

In the present disclosure, the probe connector may further include a conductive projection which projects from an outer surface of the thin cylinder portion and which frictionally contacts with an inner surface of the cylindrical contact. By providing a structure in which the conductive projection projects from the outer surface of the thin cylinder portion and contacts frictionally with the inner surface of the cylindrical contact, one end of the cylindrical contact hardly abuts against or bites with the thin cylinder portion, even if the posture of the cylindrical contact, movable along the thin cylinder portion, is inclined relative to the thin cylinder portion. Thus, the cylindrical contact can smoothly move in the extending direction of the thin cylinder portion. Further, since the thin cylinder portion (outer conductor) and the cylindrical contact are always and directly connected electrically to each other via the conductive projection, it is possible to stably maintain the electrical connection between the outer conductor (thin cylinder portion) and the cylindrical contact than a case of electrically connecting the outer conductor (thin cylinder portion) and the cylindrical contact only by the outer coil spring.

In the present disclosure, the probe connector may further include a guide slit or groove formed in the cylindrical contact to extend in an axial direction of the thin cylinder portion; and a guide projection which is formed in the conductive cover and/or the housing and which is engaged with the guide slit or groove.

The engagement between the guide slit or groove and the guide projection can prevent the self-rotation of the cylindrical contact and thus the movement of the cylindrical contact is restricted in the extending direction of the guide slit or groove, that is, in a direction along the axial direction of the thin cylinder portion (outer conductor).

In the present disclosure, the conductive cover may include: a conductive-cover body which is formed in a cylindrical shape surrounding the outer conductor; and a conductive arm which projects from the conductive-cover body and which overlaps with the cylindrical contact or the housing to be the guide projection.

In the present disclosure, the cylindrical contact may include a contact point which is projected to come into contact with the circuit board.

With this structure, a portion at which the cylindrical contact actually comes into contact with the circuit board can be limited or restricted to the contact point. That is, it is possible to always determine a portion, at which the cylindrical contact contacts with the circuit board, at a same position by providing the contact point. Otherwise, it is difficult for the contact point to be fixed at the same position due to the cylindrical shape of the cylindrical contact.

As a result, a position and a range of a pattern, formed on the circuit board, which is to be electrically connected to the cylindrical contact can be limited at a certain position and in a certain range corresponding to the contact point. In particular, in a case that the self-rotational movement of the cylindrical contact is suppressed by forming the guide slit or groove, the displacement of the contact point in the circumferential direction of the cylindrical contact, which would be otherwise caused due to the self-rotation of the cylindrical contact, does not occur. Therefore, the pattern is formed only at a certain position and in a certain range corresponding to the predetermined position of the contact point, thereby making it possible to bring the contact point and the pattern into contact electrically with each other.

A plurality of pieces of the contact point may be provided in the cylindrical contact. In this case, the plurality of contact points are preferably on circumferential positions of the cylindrical contact, which are determined by equally dividing the cylindrical contact about the center thereof, for example, by half (every 180 degrees). By providing the plurality of contact points at every equal interval as described above, when the cylindrical contact is brought into pressure contact with the circuit board, the resultant force acting on the cylindrical contact from the contact points can be made as a force directed in the axial direction of the cylindrical contact. As a result, the posture of the cylindrical contact is hardly inclined relative to the thin cylinder portion.

In the present disclosure, the center terminal may include: a center conductor which is mated with the axial terminal; a center hole which is formed in the center conductor and of which opening is faced toward the circuit board; a center coil spring which is inserted in the center hole; and a shaft-shaped contact which is formed in a shaft shape, one end of which is inserted in the center hole, and the other end of which is projected from the housing to come into contact with the circuit board; wherein the shaft-shaped contact may compress the center coil spring when the housing is attached to the circuit board and is brought into pressure contact with the circuit board by a spring force of the center coil spring; and the probe connector may further include an insulator which is inserted into the outer conductor to hold the center conductor coaxially with the outer conductor.

In the present disclosure, in the state that the housing is attached to the circuit board, the center terminal and the outer terminal are both in pressure contact with the circuit board. As a result, the range of the contact resistance variation between the center terminals with respect to the circuit board can be made to be small. Further, since the center terminal and the outer terminal can be integrally formed by the insulator, the outer terminal to which the center terminal is assembled can be made a sub-assembly as the coaxial probe. It is not necessary to assemble separately the center terminal and the outer terminal on the housing.

In the present disclosure, the housing may be constructed of a lower housing which has an upper surface and which comes into contact with the circuit board, and an upper housing having a lower surface which is in contact with the upper surface of the lower housing; the cavity in which the coaxial probe is inserted may be constructed of a lower cavity which is formed in the lower housing, and an upper cavity which is formed in the upper housing; a slit or groove may be formed in at least one of the upper surface of the lower housing and the lower surface of the upper housing, the slit or groove communicating with the lower cavity and/or the upper cavity; and the anchor of the coaxial probe may be inserted into the slit or groove.

With this structure, the anchor can be engaged with the housing on the coupling surfaces of the upper housing and the lower housing. That is, the anchor can be engaged with the housing at the center portion of the housing. Therefore, as the coaxial probe, it is possible to adopt, for example, a structure in which the anchor is formed or located at the center portion of the coaxial probe, one end portion of the coaxial probe has a pressure-contact structure of the cylindrical contact, and the coaxial plug is insertable to and pullable from the other end portion of the coaxial probe. Further, by engaging the anchor with the housing, it is possible to prevent the coaxial probe from coming off or detaching from the housing.

In the present disclosure, the outer conductor of the coaxial probe may further include a mating portion into and with which the surrounding terminal of the coaxial plug is inserted and mated, the mating portion having a structure in which a plurality of leaf springs are provided and the surrounding terminal is held by the leaf springs; the upper cavity may be formed to have a size greater than a size of the lower cavity so that the mating portion is insertable in the upper cavity and that the leaf springs are movable in the upper cavity; and the slit or groove in which the anchor is inserted may be formed only in the lower housing.

In the present disclosure, the lower cavity is formed to have a size smaller than that of the upper cavity, and the slit or groove for the anchor insertion is formed only in the lower housing. Therefore, the slit or groove for the anchor insertion can be formed in a range or area overlapping with the upper cavity. Further, by forming the slit or groove, for inserting the anchor, in the range overlapping with the upper cavity, it is not necessary in the housing to increase an occupation area occupied by each of the coaxial probes or increase the probe pitch, even though the anchor is provided in each of the coaxial probes and the slits or grooves for the anchor insertion are formed in the housing. The occupation area and the probe pitch of the coaxial probes can be made to be same to those of coaxial probes which are not provided with the anchor.

As described above, according to the probe connector of the present disclosure, the position of the coaxial probe is not easily shifted even when the coaxial plug is inserted to or pulled from the probe connector.

BRIEF DESCRIPTION OF THE DRAWINGS

The organization and manner of the structure and operation of the present disclosure, together with further objects and advantages thereof, may best be understood by reference to the following Detailed Description, taken in connection with the accompanying Figures, wherein like reference numerals identify like elements, and in which:

FIG. 3 is an exploded perspective view of a housing of FIG. 1;

DESCRIPTION OF THE PREFERRED EMBODIMENTS

While the present disclosure may be susceptible to embodiment in different forms, there is shown in the figures, and will be described herein in detail, specific embodiments, with the understanding that the disclosure is to be considered an exemplification of the principles of the present disclosure, and is not intended to limit the present disclosure to that as illustrated. In the embodiments illustrated herein, representations of directions such as up, down, left, right, front, rear and the like, used for explaining the structure and movement of the various elements of the present disclosure, are not absolute, but relative. These representations are appropriate when the elements are in the position shown in the FIG. 2. If the description of the position of the elements changes, however, it is assumed that these representations are to be changed accordingly.

Figure 1:
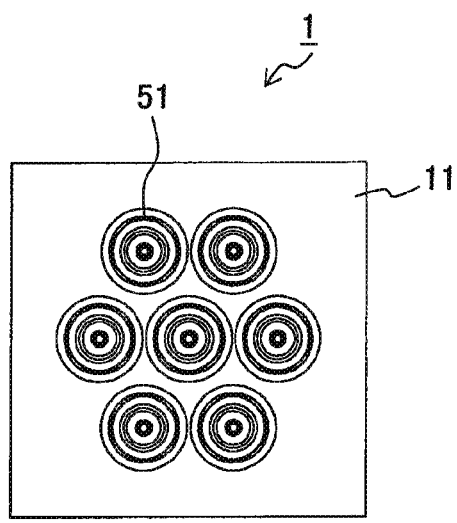
FIG. 1 is a front view of a probe connector of an embodiment of the present disclosure.
Figure 2:
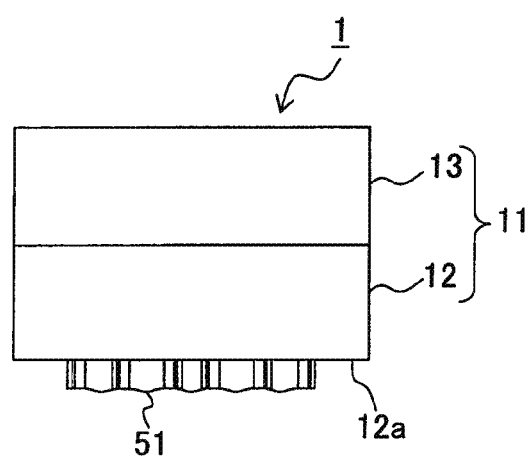
FIG. 2 is a side view of the probe connector of FIG. 1.

FIGS. 1-4 are views each showing a probe connector 1 of the embodiment. FIG. 1 is a front view of the probe connector 1 and FIG. 2 is a side view of the probe connector. The probe connector 1 includes a housing 11, made of an insulative material and having a plate-like shape, and a plurality of coaxial probes 51 inserted therein. The probe connector 1 is attached to a circuit board 2 via a rear surface (lower surface in FIG. 2) of the housing 11 (shown in FIG. 12). Further, a plug 3 is attached to a front surface (upper surface in FIG. 2) of the housing 11 (shown in FIG. 15). As will be shown in FIG. 14, the plug 3 includes a plurality of coaxial plug connectors 161, a holder 121 as a housing and a flange 122; and the holder 121 holds the plurality of coaxial plug connectors 161. Each coaxial plug connector 161 includes an axial terminal 162 and a surrounding terminal 163 surrounding the axial terminal 162. Generally, the surrounding terminal 163 is connected to a ground plane pattern, or the like, of the circuit board 2, and the axial terminal 162 is connected to a signal line pattern of the circuit board 2. FIG. 3 is an exploded perspective view of the housing 11. The housing 11 is divided into two parts by a plane extending in right to left to be parallel to the circuit board 2 and thereby includes a lower housing 12 and an upper housing 13. A lower surface 23 of the upper housing 13 and an upper surface 22 of the lower housing 12 are in contact with each other. Further, as shown in FIG. 3, a plurality of cavities 14, in which the coaxial probes 51 are inserted, are formed in the housing 11. The cavities 14 penetrate through the housing 11. Each cavity 14 is constructed of a lower cavity 24 formed in the lower housing 12 and an upper cavity 25 formed in the upper housing 13. The lower housing 12 is a portion positioned on the lower side in FIG. 2 and directly attached to the circuit board 2. The upper housing 13 is a portion positioned on the upper side in FIG. 2 and stacked on the lower housing 12.

Figure 4:
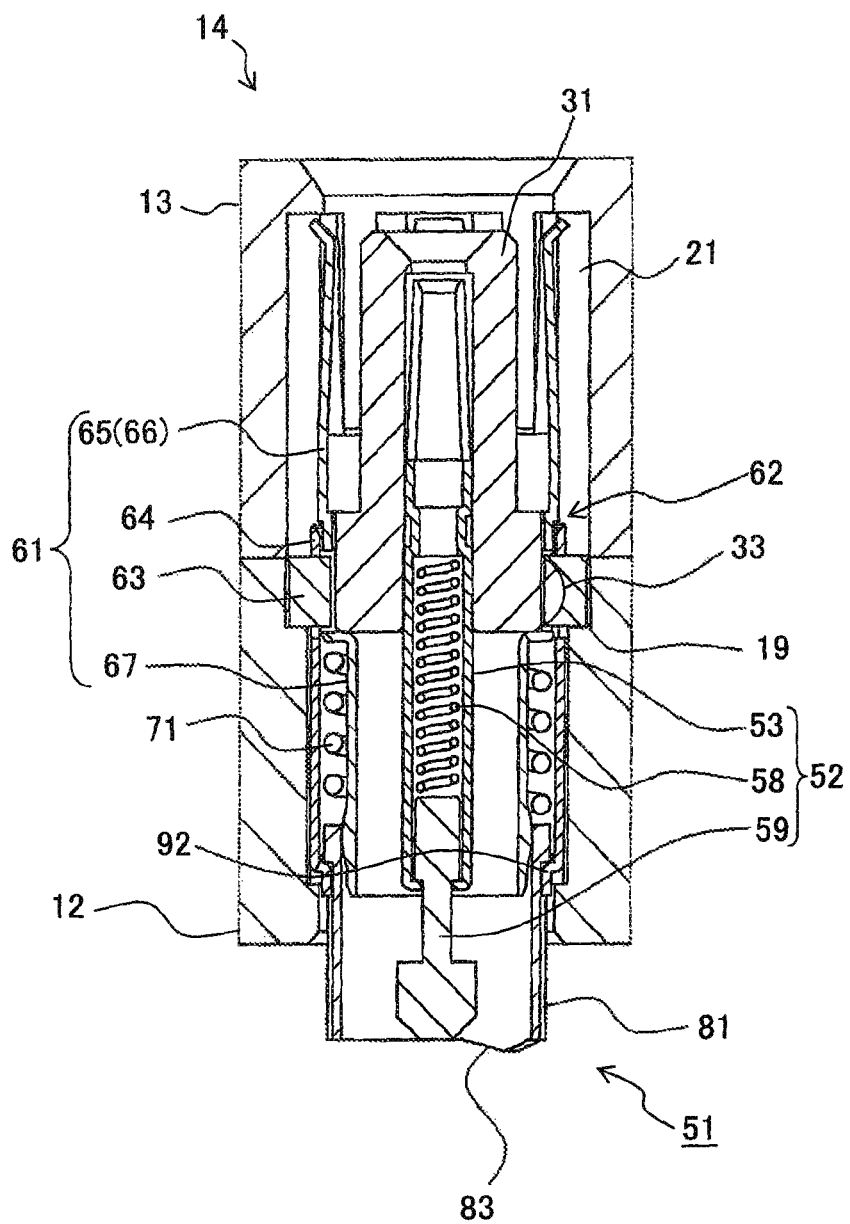
FIG. 4 is a vertical sectional view of a cavity portion of the probe connector of FIG. 1.
Figure 5:
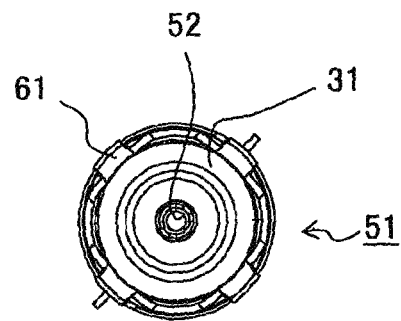
FIG. 5 is a front view of a coaxial probe of FIG. 1.
Figure 6:
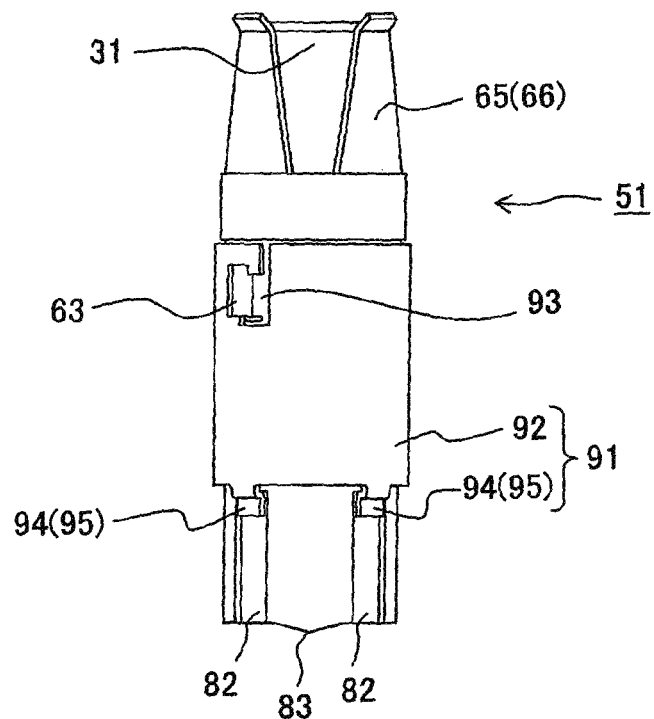
FIG. 6 is a side view of the coaxial probe of FIG. 5.
Figure 7:
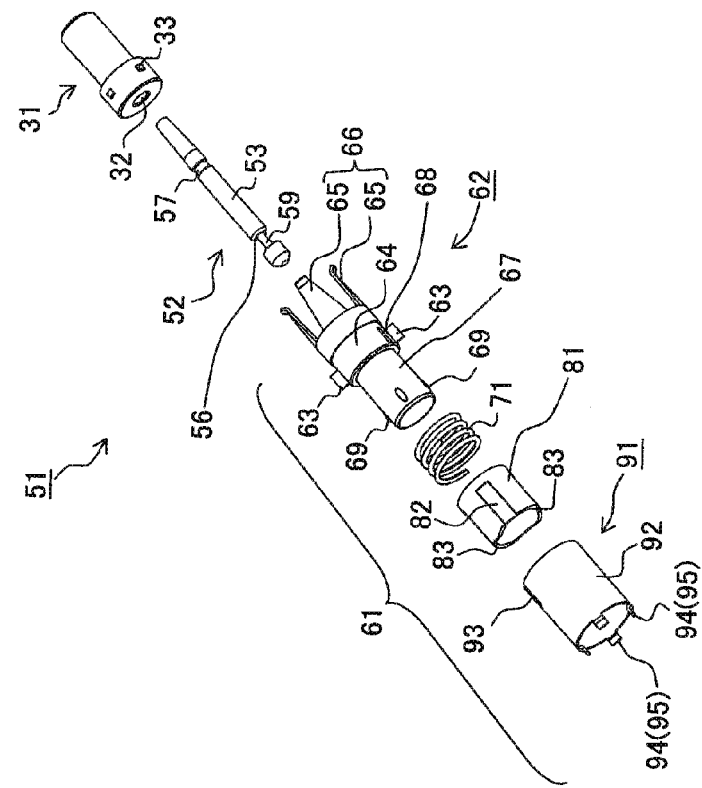
FIG. 7 is an exploded perspective view of the coaxial probe of FIG. 5.

FIGS. 5-7 are views generally showing the coaxial probe 51. FIG. 5 is a front view of the coaxial probe 51, and FIG. 6 is a side view of the coaxial probe 51. FIG. 7 is an exploded perspective view of the coaxial probe 51. As shown in FIG. 4, the coaxial probe 51 is vertically inserted in the cavity 14 formed in the housing 11. Further, the coaxial probe 51 includes: a center terminal 52 mated with the axial terminal 162 of the coaxial plug connector 161; an outer terminal 61 mated with the surrounding terminal 163 of the coaxial plug connector 161; and an insulator 31 holding and insulating the center terminal 52 in the outer terminal 61.

The center terminal 52 is preferably formed of a conductive material. As shown in FIG. 7, the center terminal 52 includes a center conductor 53, a center coil spring 58 (see FIGS. 11 and 13), and a shaft-shaped contact 59. The center conductor 53 has a long shaft shape (a basic shape as shown in FIG. 7), and is arranged at the center of the cavity 14 in the axial direction of the cavity 14 as shown in FIG. 4. At the top portion of the center conductor 53, a mating portion 55 is formed of a plurality of leaf springs 54 which hold the axial terminal 162 of the coaxial plug connector 161. Further, in the lower surface of the shaft-shaped center conductor 53, a center hole 56 is formed to extend toward the inner side of the center conductor 53 to be concentric with the center conductor 53. The center coil spring 58 is inserted into the center hole 56 of the center conductor 53.

The shaft-shaped contact 59 has a shaft shape thinner than the center conductor 53, and one end of the contact 59 is inserted in the center hole 56 of the center conductor 53 as shown in FIG. 7. Further, as shown in FIG. 4, the one end portion, of the shaft-shaped contact 59, which is inserted in the center conductor 53 is formed to have a diameter greater than that of the shaft portion of the contact 59, so that the shaft-shaped contact 59 is held by the center conductor 53 and prevents from coming off or detaching from the center conductor 53. Further, the other end of the shaft-shaped contact 59 projects from the lower housing 12 and comes into contact with a pattern 151 of the circuit board 2.

As shown in FIG. 7, the insulator 31 has a large-diameter portion and a small-diameter portion coaxial to each other and has a cylindrical shape in which a center hole 32 is formed. In the center hole 32 of the insulator 31, the center terminal 52 is inserted. A recessed portion 57 is formed in the center conductor 53 of the center terminal 52 and is abutted against one end of center coil spring 58 in a state that the center terminal 52 is inserted in the center conductor 32. Further, the center terminal 52 is assembled to the insulator 31 such as by being frictionally inserted or being engaged as to be fixed in the center hole 32. The insulator 31 holds the center terminal 52 coaxially with the outer terminal 61. The outer terminal 61 is preferably made of a conductive material such as a metal plate. The outer terminal 61, as shown in FIG. 7, includes an outer conductor 62, an outer coil spring 71, a cylindrical contact 81, and a conductive cover 91.

As shown in FIG. 7, the outer conductor 62 has a cylindrical shape as its basic structure and is arranged in the cavity 14 in the axial direction of the cavity 14 and along the inner periphery of the cavity 14, as shown in FIG. 4. Accordingly, the outer conductor 62 surrounds entirely the center terminal 52 arranged at the center of the cavity 14. As shown in FIG. 7, the outer conductor 62 includes a body portion 64 having a pair of anchors 63 projecting or protruding from the surface (outer surface) of the body portion 64; a mating portion 66 formed on the body portion 64 and constructed of four leaf springs 65 which hold the surrounding terminal 163 of the coaxial plug connector 161; and a thin cylinder portion 67 formed to be located below the body portion 64 and to be thinner than the body portion 64.

Since the outer conductor 62 has an extremely thin diameter that is about 2 mm, each of the anchors 63 is formed as a portion projecting outwardly from the outer conductor 62 by a press-working process (machining process) performed for the outer conductor 62. As described above, since the anchors 63 are formed by the press-working process, machining holes 68 are consequently formed in the body portion 64 at positions adjacent to the anchors 63 respectively.

In the outer coil spring 71, the thin cylinder portion 67 is inserted as shown in FIG. 4. As shown in FIG. 7, the cylindrical contact 81 is formed in a cylindrical shape to have a diameter same as that of the body portion 64. Further, as shown in FIG. 4, in the cylindrical contact 81, one end of the thin cylinder portion 67 is inserted from a side of the upper end of the cylindrical shape of the cylindrical contact 81. Further, four conductive projections 69 are formed on the outer surface of the thin cylinder portion 67 to project from the outer surface (see FIG. 7), and the four conductive projections 69 come into contact with the inner surface of the cylindrical contact 81 so that the conductive projections 69 are frictionally movable with respect to the inner surface of the cylindrical contact 81. Therefore, the outer conductor 62 and the cylindrical contact 81 are in direct contact with each other to be electrically connected to each other. Further, as shown in FIG. 4, the lower end of the cylindrical contact 81 projects from the lower housing 12 and comes into contact with the circuit board 2. Even in a case that the cylindrical contact 81 is inclined relative to the outer conductor 62, the cylindrical contact 81 can move smoothly without the upper end of the cylindrical contact 81 abutting against the outer conductor 62. Further, with the conductive projections 69, the thin cylinder portion 67 (the outer conductor 62) and the cylindrical contact 81 are electrically connected always and directly to each other and thus the electrical connection therebetween can be stable.

As shown in FIG. 7, on the outer surface of the cylindrical contact 81, four guide grooves 82 are formed to extend in the up and down direction. On the lower end of the cylindrical contact 81, two contact points (two pieces of projection contact points) 83 are formed which come into contact with the patterns 151 of the circuit board 2. The four guide grooves 82 and the two contact points 83 are both formed to be rotationally symmetric with respect to the center axis of the cylindrical contact 81. Further, the conductive cover 91 includes a conductive-cover body 92 having a cylindrical shape greater in diameter than the body portion 64; and four conductive arms 94 projecting downwardly from the conductive-cover body 92 to overlap with the cylindrical contact 81.

As shown in FIG. 4, the cylindrical contact 81 and the body portion 64 are inserted in the conductive-cover body 92. In the upper end of the conductive-cover body 92, a pair of hanger slits 93 is formed (see FIG. 7). As shown in FIG. 6, each of the hanger slits 93 is formed in a substantially L-character shape. In the pair of hanger slits 93, a pair of the anchors 63 of the outer conductor 62 is inserted and then the conductive cover 91 is rotated to be hooked or fixed by the anchors 63, to thereby make it possible to fix the conductive-cover body 92 to the outer conductor 62 and to bring the conductive-cover body 92 into direct contact with the outer conductor 62 as to be electrically connected to the outer conductor 62. Further, in the state that the conductive-cover body 92 is fixed to the outer conductor 62, the machining holes 68 formed adjacent to the pair of anchors 63 in the body portion 64 of the outer conductor 62 are covered by the conductive-cover body 92 which is electrically conducted to the outer conductor 62, and thus a signal does not easily leak from the machining holes 68.

The four conductive arms 94 are formed in the conductive-cover body 92 at every interval angle obtained by equally dividing the circumferential angle of the conductive-cover body 92 (namely, every 90 degrees in this embodiment). Further, the conductive arms 94 are bent inwardly. Therefore, as shown in FIG. 6, the conductive arms 94 mate with or fit to the guide grooves 82 of the cylindrical contact 81 and function as guide projections 95 engaged with the guide grooves 82. Further, since the conductive arms 94 are in frictional contact with the cylindrical contact 81 in the guide grooves 82, the conductive cover 91 and the cylindrical contact 81 comes into direct contact with each other to be directly coupled to each other.

As shown in FIG. 7, the guide grooves 82 of the cylindrical contact 81 extend from the lower end in the outer surface of the cylindrical contact 81 up to a position near the center in the outer surface of the cylindrical contact 81. That is, in the upper portion of the outer surface of the cylindrical contact 81, the guide grooves 82 are not formed. Therefore, as shown in FIG. 6, the cylindrical contact 81 descends maximally up a position at which each of the conductive arms 94 abuts against the upper end of one of the guide grooves 82, even though downward biasing force acts on the cylindrical contact 81 by the outer coil spring 71. Therefore, the cylindrical contact 81 does not fall off since being held by the conductive arms 94, even though the downward biasing force acts on the cylindrical contact 81 by the outer coil spring 71.

In the cylindrical contact 81, instead of forming the guide grooves 82, it is allowable to form guide slits each having an outline shape same as that of the guide groove 82. In this case, the conductive arms 94 are engaged with the guide slits.

To assemble the coaxial probe 51, first, the insulator 31 with the center terminal 52 assembled therein is inserted in the body portion 64 of the outer conductor 62 from the upper side (from the side of the mating portion 66). The insulator 31 abuts against the thin cylinder portion 67 in the body portion 64, projections 33 on the outer surface of the insulator 31 are engaged with the machining holes 68, and thus the insulator 31 is fixed in the body portion 64. Next, the thin cylinder portion 67 of the outer conductor 62 is inserted in the outer coil spring 71 and the cylindrical contact 81. Next, the conductive cover 91 is placed around the cylindrical contact 81 to cover the cylindrical contact 81, the outer coil spring 71 and the outer conductor 62 with the conductive cover 91, and the hanger slits 93 of the conductive cover 91 are hooked or fixed to the anchors 63 of the outer conductor 62. With this, the coaxial probe 51 shown in FIG. 6 is assembled and completed. Since the center terminal 52, the outer terminal 61 and the insulator 31 of the coaxial probe 51 are integrally assembled by themselves as described above, the coaxial probe 51 can be a sub-assembly part which is previously assembled before a process of assembling the coaxial probe 51 in the housing 11.

Figure 8:
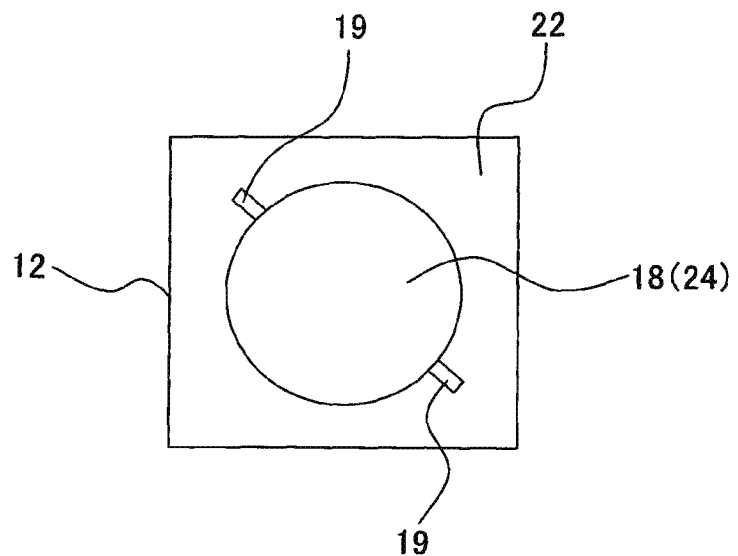
FIG. 8 is a view showing a part of the upper surface of a lower housing of FIG. 3.

FIG. 8 is a view showing a part of the coupling surface 22 (upper surface of the lower housing 12) via which the lower housing 12 is coupled to the upper housing 13. The lower housing 12 has center through holes 18 which are formed in the lower housing 12 and in each of which the lower half portion, namely a portion located below the anchors 63, of one of the coaxial probes 51 is inserted. Each of the center through holes 18 forms the lower cavity 24. In addition, slits 19 are formed in the lower housing 12 into which the pair of anchors 63 is to be press-fitted. The slits 19 for press-fitting the anchor 63 are formed in the upper surface 22 (coupling surface coupled to the upper housing 13) of the lower housing 12 and communicate with the lower cavity 24.

Figure 9:
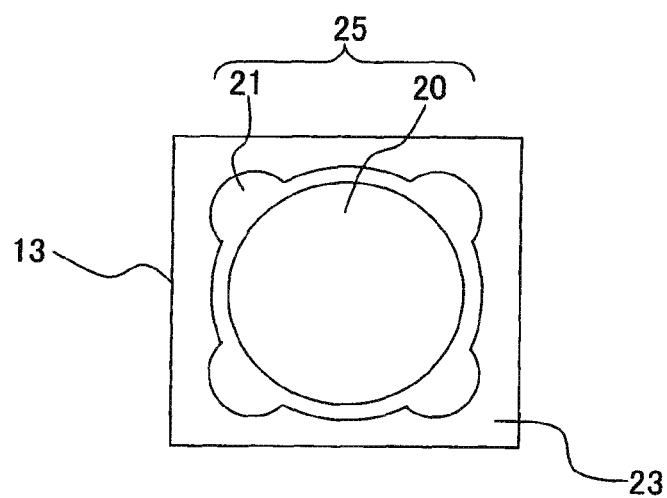
FIG. 9 is a view showing a part of the lower surface of an upper housing of FIG. 3.

FIG. 9 is a view showing a part of the coupling surface 23 (lower surface of the upper housing 13) via which the upper housing 13 is coupled to the lower housing 12. FIG. 9 shows a range or an area overlapping with the range or area shown in FIG. 8. The upper housing 13 has center through holes 20 which are formed in the upper housing 13 and in each of which the upper half portion, namely a portion located above the anchors 63, of one of the coaxial probes 51, is inserted. Each of the center through holes 20 of the upper housing 13 has a diameter substantially same as that of the center through hole 18 of the lower housing 12 shown in FIG. 8. In addition, around the center through hole 20 of the upper housing 13, escape recessed portions (clearance recesses) 21 are formed at positions each corresponding to one of the leaf springs 65 of the mating portion 66 of the outer conductor 62 so as to allow the leaf springs 65 to move in the clearance recess 22. The center through hole 20 and the clearance recesses 21 form the upper cavity 25.

As shown in FIGS. 8 and 9, the upper cavity 25 is formed to have a size greater than the lower cavity 24 so that the mating portion 66 can be inserted in the upper cavity 25 and further that the leaf springs 65 are movable in the upper cavity 25. Further, the slits 19 for press-fitting the anchor 63 are formed in an area overlapping with the upper cavity 25.

The slits 19 for press-fitting the anchor 63 may be formed both in the lower housing 12 and the upper housing 13 or may be formed only in the upper housing 13, instead of being formed only in the lower housing 12.

Then, as shown in FIG. 3, each of the coaxial probes 51 in a sub-assembled state in FIG. 6 is inserted in one of the cavities 14 (24) of the lower housing 12, with the cylindrical contact 81 positioned on the lower side. The anchors 63 of each of the coaxial probes 51 are press-fitted in the slits 19 of the lower housing 12, and the coaxial probe 51 is fixed to the lower housing 12. Next, the upper housing 13 is stacked on the lower housing 12. The upper half portion of each of the coaxial probes 51 is inserted in one of the cavities 14 of the upper housing 13. Consequently, the coaxial probes 51 are housed in the cavities 14 and the probe connector 1 shown in FIGS. 1 and 2 is assembled.

Figure 10:
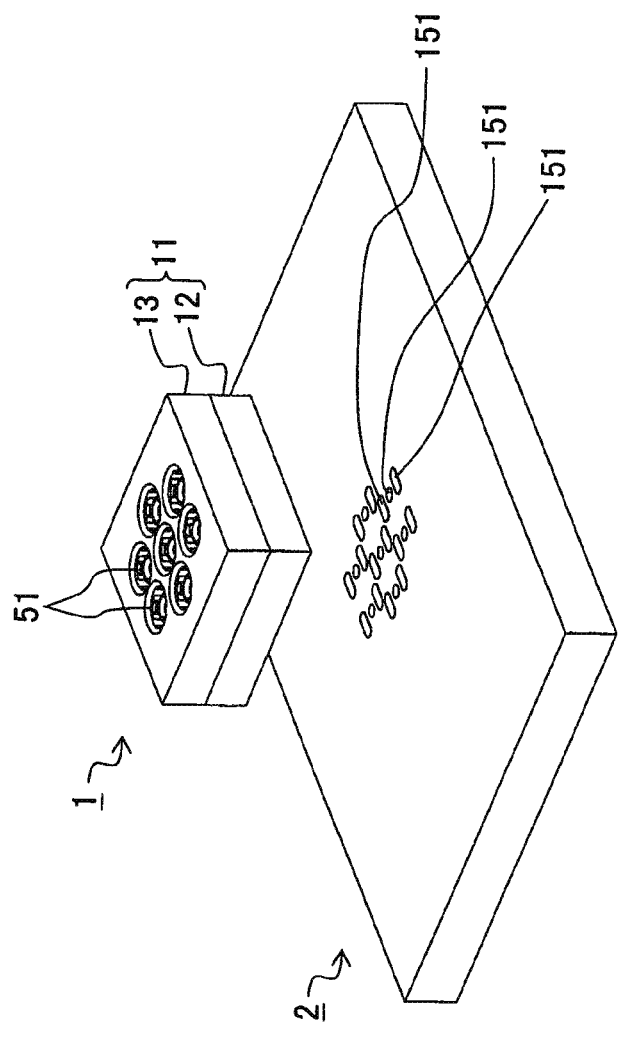
FIG. 10 is a perspective view showing a state before the probe connector of FIG. 1 is attached to a circuit board.
Figure 11:
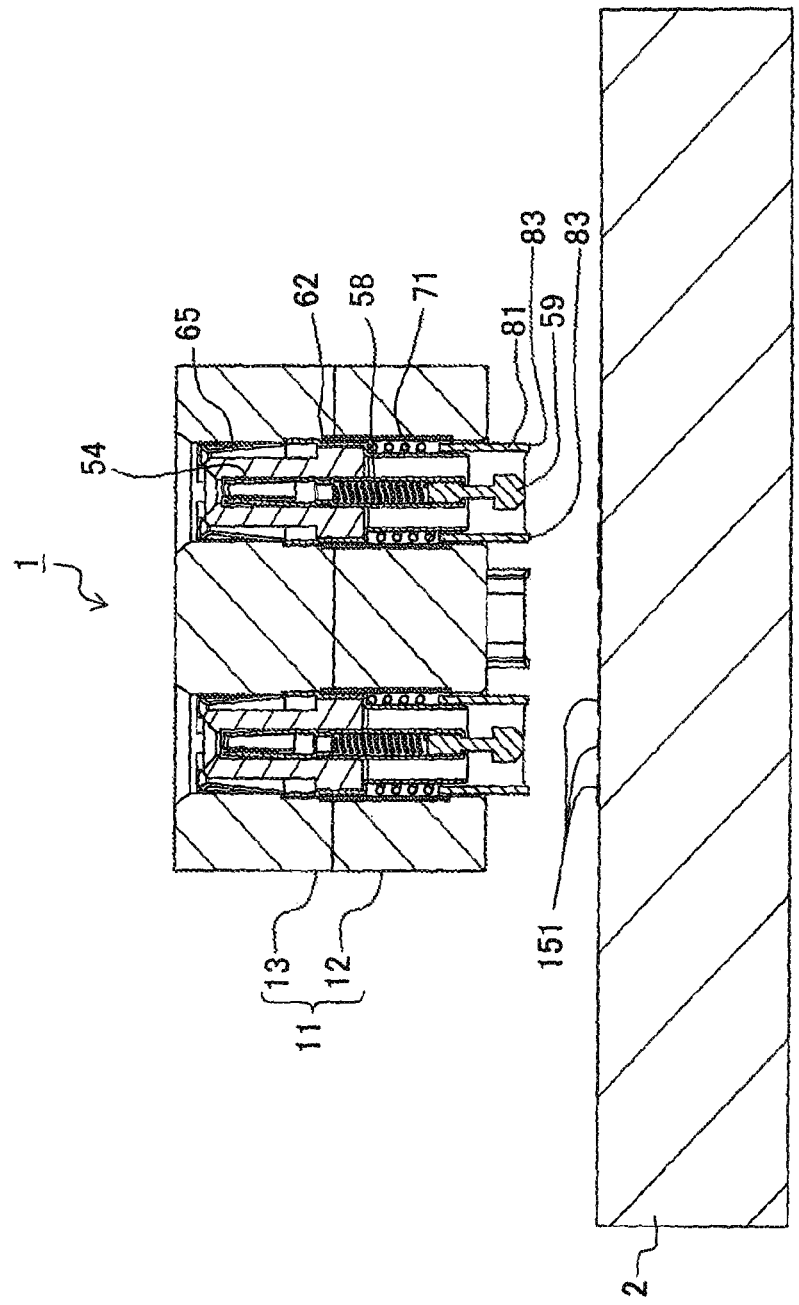
FIG. 11 is a vertical sectional view showing the state of FIG. 10.
Figure 12:
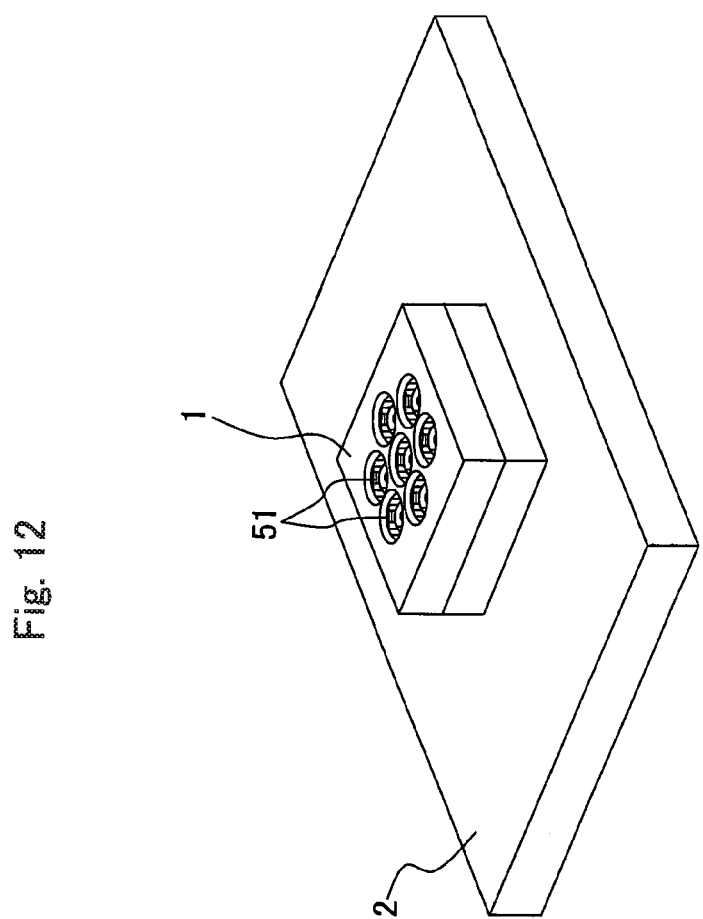
FIG. 12 is a perspective view showing a state that the probe connector of FIG. 1 is attached to the circuit board.
Figure 13:
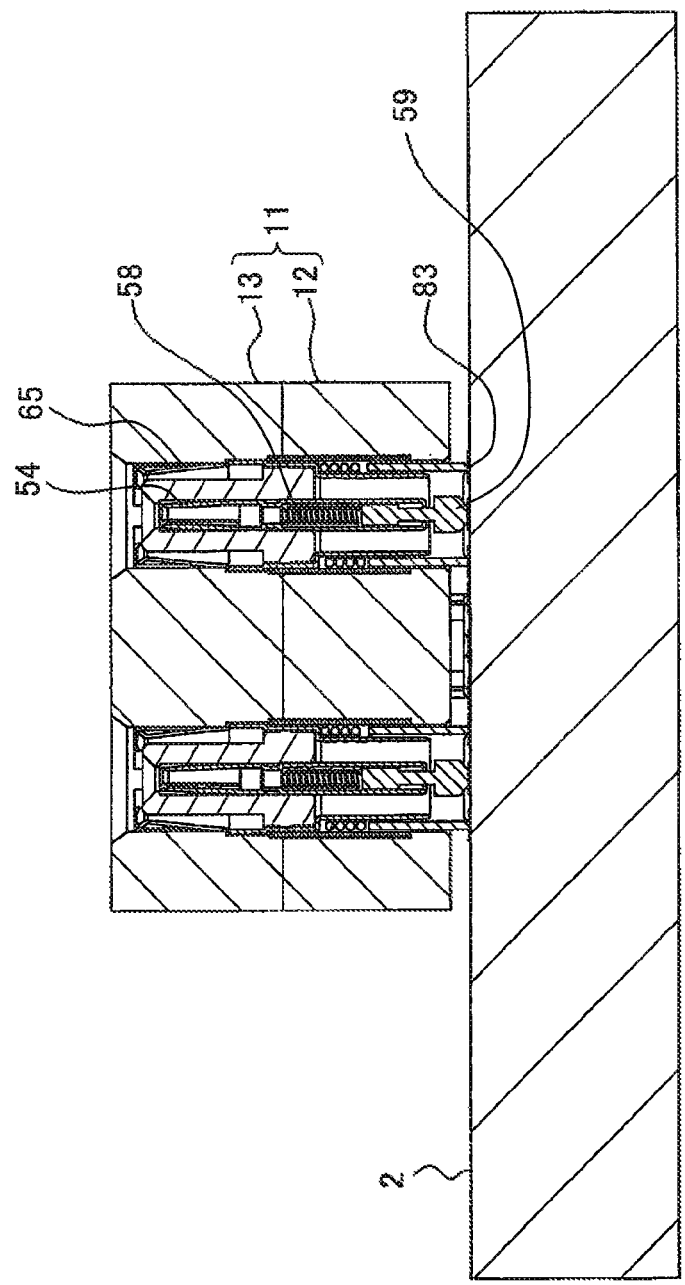
FIG. 13 is a vertical sectional view showing the state of FIG. 12.

FIGS. 10 to 13 are views each showing the probe connector 1 of this embodiment and the circuit board 2. FIG. 10 is a perspective view showing a state before the probe connector 1 is attached to the circuit board 2, and FIG. 11 is a vertical sectional view showing the state shown in FIG. 10. Further, FIGS. 12 and 13 are a perspective view and a vertical sectional view, respectively, showing a state that the probe connector 1 is attached to the circuit board 2.

As shown in FIG. 10, on the circuit board 2, a plurality of land patterns 151 and electrical wirings such as through holes (not shown) are formed. Three pieces of the land patterns 151 arranged in a line correspond to the pair of contact points 83 of the cylindrical contact 81 and the shaft-shaped contact 59 in the single coaxial probe 51.

As shown in FIG. 11, in the probe connector 1 before attached to the circuit board 2, the cylindrical contacts 81 and the shaft-shaped contacts 59 of the coaxial probes 51 project from the lower surface 12a (attachment-surface to be attached to the circuit board 2) of the lower housing 12.

When the probe connector 1 is pressed against the circuit board 2, then as shown in FIG. 13, the pair of contact points 83 of each of the cylindrical contacts 81 come into contact with the land patterns 151 of the circuit board 2, and thus each of the cylindrical contacts 81 compresses the outer coil spring 71, so that the cylindrical contact 81 is smoothly led or guided into the lower housing 12; further, each of the shaft-shaped contacts 59 comes into contact with the land pattern 151 of the circuit board 2, and then each of the shaft-shaped contacts 59 compresses the center coil spring 58 so that the shaft-shaped contact 59 is smoothly led or guided into the lower housing 12; thereafter, the lower surface 12a of the housing 11 comes into contact with the circuit board 2. As described above, since it is the contact points 83 which first come into contact with the land patterns 151, the outer terminal 61 functions as a ground terminal to make it possible to connect the probe connector 1 and the circuit board 2 securely even in a case that the probe connector 1, the circuit board 2, etc. are charged by static electricity or the like. Further, the probe connector 1 may be fixed on the circuit board 2 by a common method such as screwing down or press fitting.

Since the conductive arms 94 are engaged or fitted with the guide grooves 82 of the cylindrical contact 81, the cylindrical contact 81 does not rotate by itself while led into the lower housing 12; and the cylindrical contact 81 is led straight in the axial direction of the outer conductor 62. Also in the state that the cylindrical contact 81 is guided in the lower housing 12, the pair of contact points 83 are in contact with the land patterns 151 of the circuit board 2.

In the mounted state shown in FIGS. 12 and 13, the pair of contact points 83 of each of the cylindrical contacts 81 led into the lower housing 12 are brought into pressure-contact with the land patterns 151 of the circuit board 2 by the force of the outer coil spring 71. Consequently, the outer terminal 61 of each of the coaxial probes 51 is electrically and securely connected to the land patterns 151 of the circuit board 2. Further, the shaft-shaped contact 59 led into the lower housing 12 is brought into pressure-contact with the land pattern 151 of the circuit board 2 by the force of the center coil spring 58. With this, the center terminal 52 of each of the coaxial probes 51 is electrically and securely connected to the land pattern 151 of the circuit board 2.

Figure 14:
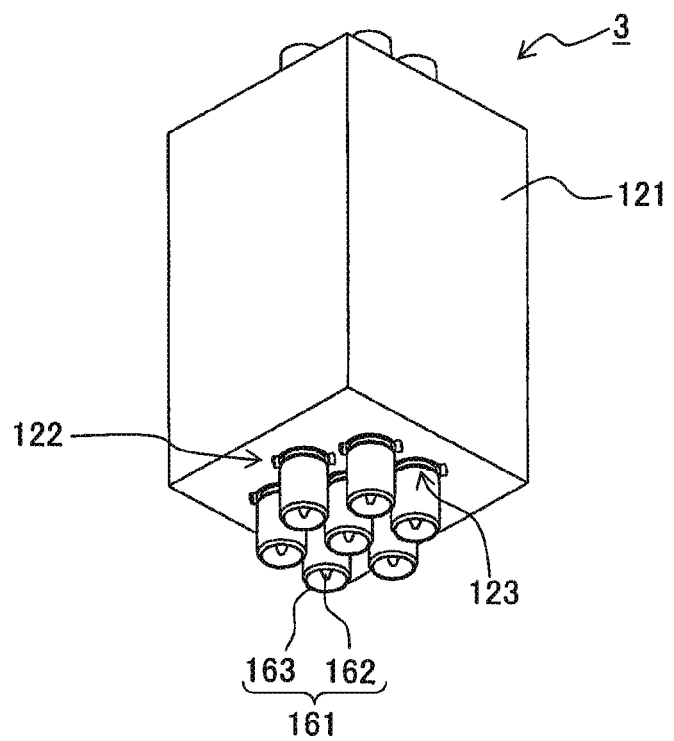
FIG. 14 is a perspective view of a plug connected to the probe connector of FIG. 1.

FIG. 14 is a perspective view of the plug 3 which is to be attached to the probe connector 1 of this embodiment. The plug 3 includes a holder 121 in a plate shape having a size substantially same as that of the housing 11. In the holder 121, a plurality of cavities 123 are formed at positions corresponding to the positions, respectively, of the coaxial probes 51 of the probe connector 1. In the cavities 123, the coaxial plug connectors 161 are inserted respectively. Each of the coaxial plug connectors 161 includes the axial terminal 162 and the surrounding terminal 163 which surrounds the axial terminal 162 and which is arranged coaxial with the axial terminal 162.

Figure 15:
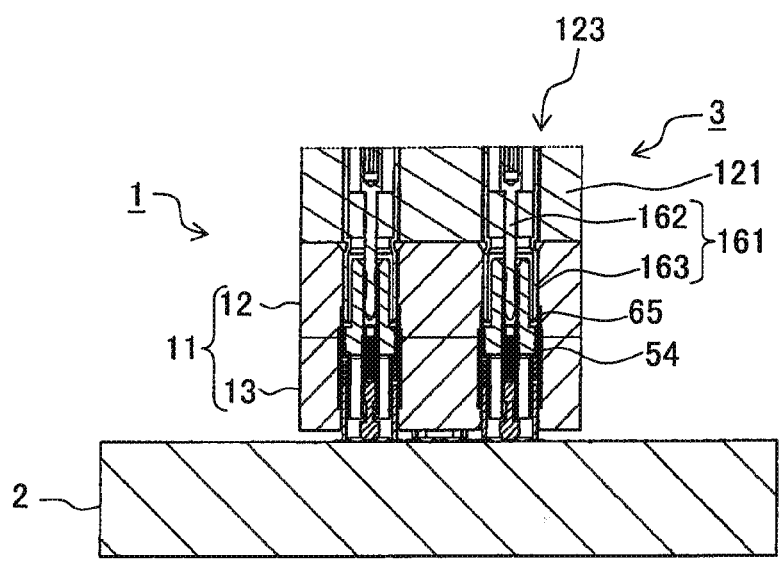
FIG. 15 is a vertical sectional view showing the plug of FIG. 14 connected to the probe connector.
Figure 16:
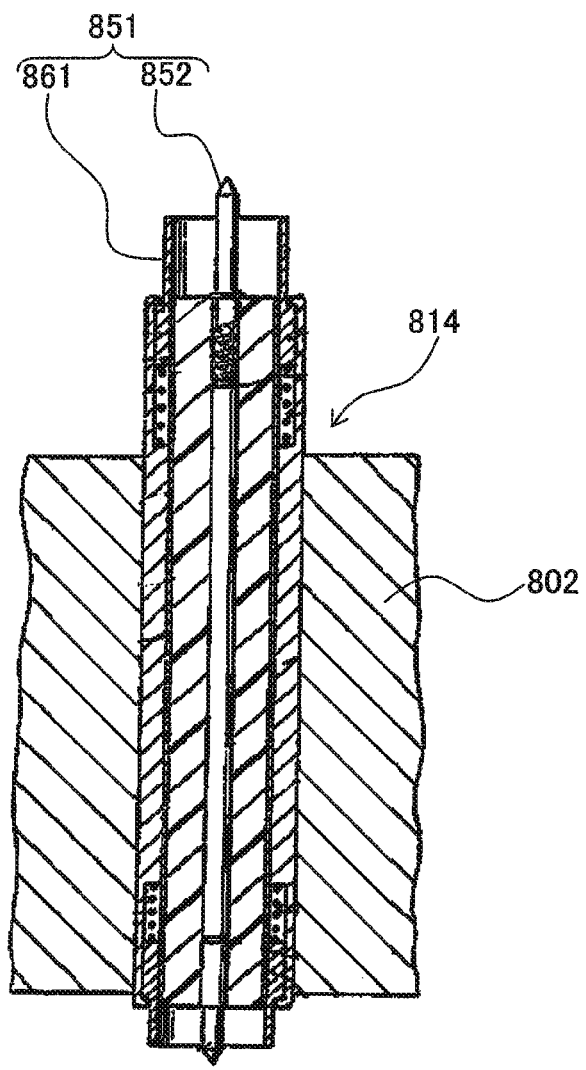
FIG. 16 is a cross-sectional view showing a conventional coaxial movable contact probe.
Figure 17:
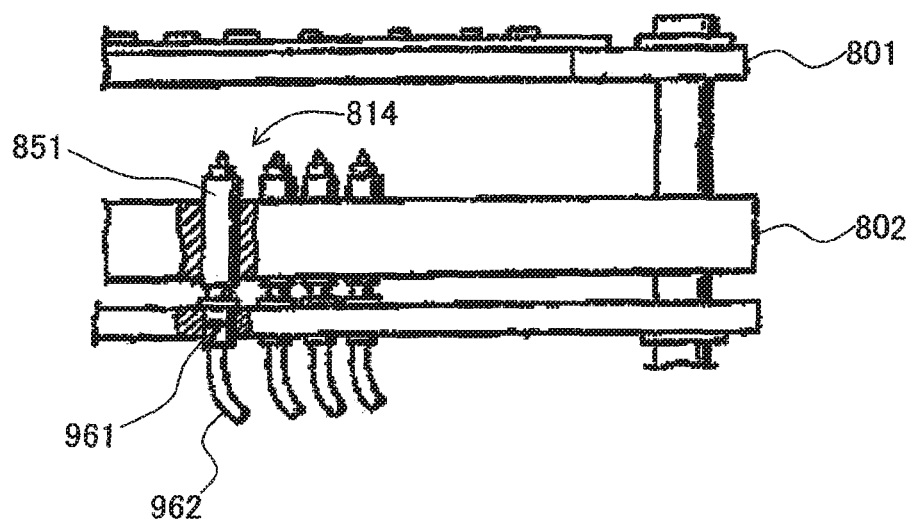
FIG. 17 is a view showing a state that the coaxial movable contact probe of FIG. 16 in use.

FIG. 15 is a view showing a state that the plug 3 is connected to the probe connector 1. In this connected state, each of the coaxial plug connectors 161 of the plug 3 are mated with one of the coaxial probes 51 of the probe connector 1. In this mated state, the axial terminal 162 of each of the coaxial plug connectors 161 is inserted into the leaf springs 54 of the mating portion 55 of the center conductor 53 to thereby push the leaf springs 54. Since the leaf springs 54 are pushed by and in pressure contact with the axial terminal 162 of the coaxial plug connector 161, the axial terminal 162 of the coaxial plug connector 161 is electrically and securely connected to the center terminal 52 of the coaxial probe 51. Consequently, the axial terminal 162 of the coaxial plug connector 161 is electrically and securely connected to the land pattern 151 of the circuit board 2.

Further, the surrounding terminal 163 of the coaxial plug connector 161 is inserted into the plurality of leaf springs 65 of the mating portion 66 of the outer conductor 62 to push the leaf springs 65. In the upper housing 13, the clearance recesses 21 are formed at places corresponding to the leaf springs 65 respectively. Accordingly, the leaf springs 65 are freely pushed to be opened widely without abutting against the upper housing 13. Since the leaf springs 65 are pushed by and in pressure contact with the surrounding terminal 163 of the coaxial plug connector 161, the surrounding terminal 163 of the coaxial plug connector 161 is electrically and securely connected to the outer terminal 61 of the coaxial probe 51.

Consequently, the surrounding terminal 163 of the coaxial plug connector 161 is electrically and securely connected to the land pattern 151 of the circuit board 2.

As described above, the probe connector 1 of this embodiment physically and electrically connects the circuit board 2 and the coaxial plug connectors 161, with the probes 51 each having the coaxial structure in which the center terminal 52 is surrounded by the outer terminal 61.

Further, since each of the coaxial probes 51 is fixed to the housing 11 by the anchors 63, the coaxial probe 51 is not displaced relative to the housing 11 even when the coaxial plug connector 161 (plug 3) is inserted to or pulled from the coaxial probe 51 (probe connector 1). Further, since the positions of the coaxial probes 51 with respect to the housing 11 can be maintained at the initially aligned positions, the range of contact pressure variation between the coaxial probes 51 with respect to the circuit board 2 can be maintained or regulated within a desired high-pressure range, and a range of the contact resistance variation with respect to the substrate 2 can be reduced to be small among the coaxial probes 51. Further, the machining holes 68 are formed in the outer conductor 62 as a result of the presswork (machining) performed for forming the anchors 63 in the coaxial probe 51 (outer conductor 62) because the coaxial probe 51 (outer conductor 62) has a small diameter of about 2 mm. However, since the conductive cover 91 covers the machining holes 68, the signal is prevented from leaking.

When the coaxial probe 51 (outer conductor 62) is used in an IC inspection and test apparatus (IC tester) or the like, with a coaxial cable, to connect an inspection target circuit board on which an inspection target IC is mounted and a measuring circuit board on which a signal generator circuit, a comparator and so on are mounted, then it is desirable that the coaxial probe 51 (outer conductor 62) has a diameter of about 1 mm to 3 mm. To form the anchor 63 in such a thin coaxial probe 51 (outer conductor 62), presswork (machining) needs to be adopted. In this case also, the machining holes 68 are formed in the outer conductor 62 by the presswork. Based on these structures of the probe connector 1 according to this embodiment, the attenuation and/or reflection of high-frequency signal components do not easily occur in the coaxial probes 51, and the insertion loss due to the insertion of the coaxial probes 51 (DIP characteristic) can be reduced. Further, the crosstalk between the coaxial probes 51 can be reduced. As a result, it is possible to obtain the performance sufficient for transmitting high-frequency signal components. Furthermore, the probe connector 1 can be used in the IC tester or the like in order to connect, with a coaxial cable, an inspection target circuit board on which an inspection target IC is mounted and a measuring circuit board on which a signal generator circuit, a comparator, and so on are mounted.

The probe connector 1, even without the conductive cover 91, can have performance sufficient for transmitting signal components in lower range of high frequency band. That is, the outer terminal 51 may be constructed of two components or parts, i.e., the outer terminal 62 and the cylindrical contact 81. When the outer terminal 51 is constructed of the two parts as in this modification of the embodiment, the attenuation and/or reflection of signal components in lower range of high frequency band can be suitably prevented, the crosstalk can be suitably reduced, and the insertion loss due to the insertion of the probe connector (DIP characteristic) can be suitably reduced. Further, in this modification adopting the two-parts structure, the number of parts can be reduced compared with a case adopting the structure with three parts as in this embodiment.

In the probe connector 1 of this embodiment, as shown in FIGS. 8 and 9, a formation range or area of the slits 19 for press-fitting the anchor 63 is limited within a formation range of the cavity 14 of the upper housing 12. Therefore, the coaxial probes 51 can be arranged in the housing 11 at the same channel pitch (channel density) as that of coaxial probes not provided with the anchors 63. Therefore, it is possible to use the coaxial probes 51 applicable to high frequencies, without increasing an occupation area of the coaxial probes 51 in the circuit board 2.

The probe connector of the present disclosure is capable of connecting a coaxial plug and a circuit board. Therefore, the probe connector of the present disclosure can be used, for example, in an IC tester and the like in order to connect, with a coaxial cable, an inspection target circuit board on which an inspection target IC is mounted and a measuring circuit board on which a signal generator circuit, a comparator, and so on are mounted. Further, while a preferred embodiment of the present disclosure is shown and described, it is envisioned that those skilled in the art may devise various modifications without departing from the spirit and scope of the foregoing Description and the appended claims.

What is claimed is:

1. A probe connector which connects a circuit board and a coaxial plug including an axial terminal and a surrounding terminal, the probe connector comprising:
   a coaxial probe including a center terminal which is electrically connected to the axial terminal of the coaxial plug and to the circuit board, and an outer terminal which is coaxial with the center terminal and is electrically connected to the surrounding terminal and to the circuit board;
   wherein the outer terminal includes an outer conductor which is formed in a cylindrical shape surrounding the center terminal and is mated with the surrounding terminal, an anchor which is formed, as a projection, on part of an outer surface of the outer conductor so that a hole is formed on the part of the outer surface, and a conductive cover which covers the hole and which is electrically connected to the outer conductor.

2. The probe connector according to claim 1, further comprising:
   a housing; and
   a cavity which is formed penetrating through the housing and in which the coaxial probe is inserted;
   wherein the coaxial probe and the housing are engaged with each other via the anchor of the outer terminal.

3. The probe connector according to claim 2, further comprising:
   a thin cylinder portion which is formed on the outer conductor at another part of the outer conductor, nearer to a side of the circuit board than the part at which the anchor is formed, and which is formed to have a cylindrical shape thinner than the part at which the anchor is formed;
   an outer coil spring in which the thin cylinder portion is inserted; and
   a cylindrical contact which is formed in a cylinder shape, into an end of which the thin cylinder portion is inserted, and the other end of which projects from the housing to come into contact with the circuit board;
   wherein when the housing is attached to the circuit board, the cylindrical contact moves along the thin cylinder portion to compress the outer coil spring and to be brought into pressure contact with the circuit board by a spring force of the outer coil spring.

4. The probe connector according to claim 3, further comprising a conductive projection which projects from an outer surface of the thin cylinder portion and which frictionally contacts with an inner surface of the cylindrical contact.

5. The probe connector according to claim 3, further comprising:
a guide slit or groove formed in the cylindrical contact to extend in an axial direction of the thin cylinder portion; and
a guide projection which is formed in the conductive cover and/or the housing and which is engaged with the guide slit or groove.

6. The probe connector according to claim 5, wherein the conductive cover includes:
a conductive-cover body which is formed in a cylindrical shape surrounding the outer conductor; and
a conductive arm which projects from the conductive-cover body and which overlaps with the cylindrical contact or the housing to be the guide projection.

7. The probe connector according to claim 3, wherein the cylindrical contact has a contact point which is projected to come into contact with the circuit board.

8. The probe connector according to claim 2, wherein the center terminal includes:
a center conductor which is mated with the axial terminal;
a center hole which is formed in the center conductor and of which opening is faced toward the circuit board;
a center coil spring which is inserted in the center hole; and
a shaft-shaped contact which is formed in a shaft shape, one end of which is inserted in the center hole, and the other end of which is projected from the housing to come into contact with the circuit board;
wherein the shaft-shaped contact compresses the center coil spring when the housing is attached to the circuit board and is brought into pressure contact with the circuit board by a spring force of the center coil spring; and
the probe connector further includes an insulator which is inserted into the outer conductor to hold the center conductor coaxially with the outer conductor.

9. The probe connector according to claim 2, wherein:
the housing is constructed of a lower housing which has an upper surface and which comes into contact with the circuit board, and an upper housing having a lower surface which is in contact with the upper surface of the lower housing;
the cavity in which the coaxial probe is inserted is constructed of a lower cavity which is formed in the lower housing, and an upper cavity which is formed in the upper housing;
a slit or groove is formed in at least one of the upper surface of the lower housing and the lower surface of the upper housing, the slit or groove communicating with the lower cavity and/or the upper cavity; and
the anchor of the coaxial probe is inserted into the slit or groove.

10. The probe connector according to claim 9, wherein:
the outer conductor of the coaxial probe further includes a mating portion into and with which the surrounding terminal of the coaxial plug is inserted and mated, the mating portion having a structure in which a plurality of leaf springs are provided and the surrounding terminal is held by the leaf springs;
the upper cavity is formed to have a size greater than a size of the lower cavity so that the mating portion is insertable in the upper cavity and that the leaf springs are movable in the upper cavity; and
the slit or groove in which the anchor is inserted is formed only in the lower housing.

\* \* \* \* \*